US007665416B2

(12) United States Patent
Gschwandtner et al.

(10) Patent No.: US 7,665,416 B2
(45) Date of Patent: Feb. 23, 2010

(54) APPARATUS FOR GENERATING EXCITED AND/OR IONIZED PARTICLES IN A PLASMA AND A METHOD FOR GENERATING IONIZED PARTICLES

(75) Inventors: Alexander Gschwandtner, Munich (DE); Josef Mathuni, Munich (DE); Alexander Mattheus, Taufkirchen (DE); Stephan Schneider, Taufkirchen (DE); Jürgen Sellmaier, Munich (DE); Heinz Steinhardt, Kottingbrunn (AT)

(73) Assignee: R3T GmbH Rapid Reactive Radicals Technology, Taufkirchen (DE)

( * ) Notice: Subject to any disclaimer, the term of this patent is extended or adjusted under 35 U.S.C. 154(b) by 91 days.

(21) Appl. No.: 11/450,871

(22) Filed: Jun. 12, 2006

(65) Prior Publication Data

US 2006/0290301 A1   Dec. 28, 2006

Related U.S. Application Data

(63) Continuation of application No. PCT/EP2004/011119, filed on Oct. 5, 2004.

(30) Foreign Application Priority Data

Dec. 12, 2003   (DE) .................. 103 58 329

(51) Int. Cl.
*C23C 16/00* (2006.01)
*H01J 7/24* (2006.01)
(52) U.S. Cl. ............... 118/723 R; 118/723 VE; 118/724; 118/720; 315/111.71; 315/111.21

(58) Field of Classification Search ................. 156/345, 156/345.53, 345.49; 118/723, 723 VE, 723 R; 204/298; 315/111, 111.71, 111.21
See application file for complete search history.

(56) References Cited

U.S. PATENT DOCUMENTS

| 2004/0129313 A1* | 7/2004 | Aharonov et al. ........... 137/375 |
| 2006/0006754 A1* | 1/2006 | Calico ................... 310/156.43 |
| 2007/0284044 A1* | 12/2007 | Matsumoto et al. .... 156/345.29 |
| 2008/0029030 A1* | 2/2008 | Goto et al. .............. 118/723 R |

FOREIGN PATENT DOCUMENTS

| DE | 196 08 949 A1 | 9/1997 |
| DE | 197 27 857 C1 | 4/1999 |
| DE | 198 56 307 C1 | 1/2000 |
| DE | 198 47 848 C1 | 5/2000 |
| DE | 101 16 502 A1 | 10/2002 |
| DE | 101 45 131 A1 | 3/2003 |
| EP | 0 334 184 A | 9/1989 |
| GB | 2 397 782 B | 4/2006 |
| JP | 01-039714 A | 2/1989 |
| JP | 01-071098 A | 3/1989 |
| JP | 07-029889 | 4/2000 |
| WO | WO 03/015122 A | 2/2003 |
| WO | WO 03/076790 A1 | 9/2003 |

* cited by examiner

*Primary Examiner*—Tuyet Vo
(74) *Attorney, Agent, or Firm*—Baker & Hostetler LLP

(57) ABSTRACT

An apparatus is described for generating excited and/or ionized particles in a plasma with a generator for generating an electromagnetic wave and an excitation chamber with a plasma zone in which the excited and/or ionized particles are formed. At least one excitation chamber is arranged in an insulating material off-center relative to a ring-cylindrical outer conductor.

28 Claims, 7 Drawing Sheets

APPARATUS FOR GENERATING EXCITED AND/OR IONIZED PARTICLES IN A PLASMA AND A METHOD FOR GENERATING IONIZED PARTICLES

CROSS-REFERENCE TO RELATED APPLICATIONS

This application is a Continuation of Patent Cooperation Treaty (PCT) Application No. PCT/EP2004/011119, filed on Oct. 5, 2004, entitled, DEVICE FOR PRODUCING EXCITED AND/OR IONIZED PARTICLES IN A PLASMA AND METHOD FOR PRODUCING IONISED PARTICLES, which claims priority to German Patent Application No. DE 103 58 329.7, filed on Dec. 12, 2003.

The invention relates to an apparatus for generating excited and/or ionized particles in a plasma with a generator for generating an electromagnetic wave and an excitation chamber with a plasma zone in which the excited and/or ionized particles are formed, with the excitation chamber being disposed between an inner conductor and an outer conductor. The invention further relates to a method for generating excited and/or ionized particles in a plasma by means of this apparatus.

FIELD OF THE INVENTION

Plasma-coating methods are currently frequently used for producing silicon semiconductor elements and generally for coating methods. The coating occurs in an excitation chamber with a plasma zone, in which the excited and/or ionized particles are formed.

BACKGROUND OF THE INVENTION

An apparatus of this kind has been described in DE-A1-19847948. Good results in a large number of fields of applications are achieved with this apparatus.

The invention is based on the object of providing an apparatus and a method of the kind mentioned above with which plasma with purposefully controllable properties can be better produced in view of further fields of applications.

SUMMARY OF THE INVENTION

This object is achieved in accordance with the invention by an apparatus according to claim 1.

In accordance with the invention, an apparatus for generating excited and/or ionized particles in a plasma is provided. The apparatus comprises a generator for generating an electromagnetic wave and an excitation chamber with a plasma zone, in which the excited and/or ionized particles are formed. An inner conductor and outer conductor are further provided in order to produced a plasma by applying electric voltages of suitable frequency. In accordance with the invention, at least one excitation chamber is arranged in the apparatus in an insulating material off-center relative to a ring-cylindrical outer conductor. It can be provided especially that several excitation chambers are arranged in the insulating material off-center relative to the outer conductor, which excitation chambers are distributed about the central axis of the ring-cylindrical outer conductor.

One advantage of the invention is to provide an apparatus for generating plasma in which plasmas of different process gases can be generated in the several excitation chambers. An optimal work result can still be achieved by mixing the plasmas and supplying the plasma mixture to the workpiece. It is principally sufficient when plasmas generated in the individual chambers mix in the working area on the workpiece. The outlets of the chambers are preferably joined to a common outlet, so that the plasmas already mix in the outlet line.

A further advantage of the invention is generating excited particles in a plasma of high density which is highly limited in a spatial respect by electrodes and insulators. The particles are guided thereafter as neutral excited particles to respective reaction chambers in order to process workpieces. In contrast to apparatuses in which the electromagnetic wave is injected directly into the reaction chamber in which the workpiece is located and the excited particles can thus attack the surfaces of the reaction chamber, the location of plasma generation is very limited in the apparatus in accordance with the invention and thus offers a lower corroding surface.

The object in accordance with the invention is achieved with respect to the method of the invention in such a way that plasma generation occurs in the individual chambers on the basis of different parameters. The parameters for generating a plasma are principally known.

Preferred further developments of the invention are described in the dependent claims.

BRIEF DESCRIPTION OF THE DRAWINGS

The invention is now explained in closer detail by reference to several embodiments shown in the drawings, wherein:

FIG. 1 shows a first embodiment of a plasma generation unit for generating excited and/or ionized particles in a plasma. The plasma generation unit comprises a generator 11 for generating an electromagnetic wave with an excitation frequency. A magnetron which produces microwaves can be used as a generator 11 for example. The microwave is injected into a hollow conductor 12 via an antenna 13 in order to supply the microwave to an excitation chamber 20 of the plasma generation unit.

DETAILED DESCRIPTION OF THE INVENTION

Figure 1:
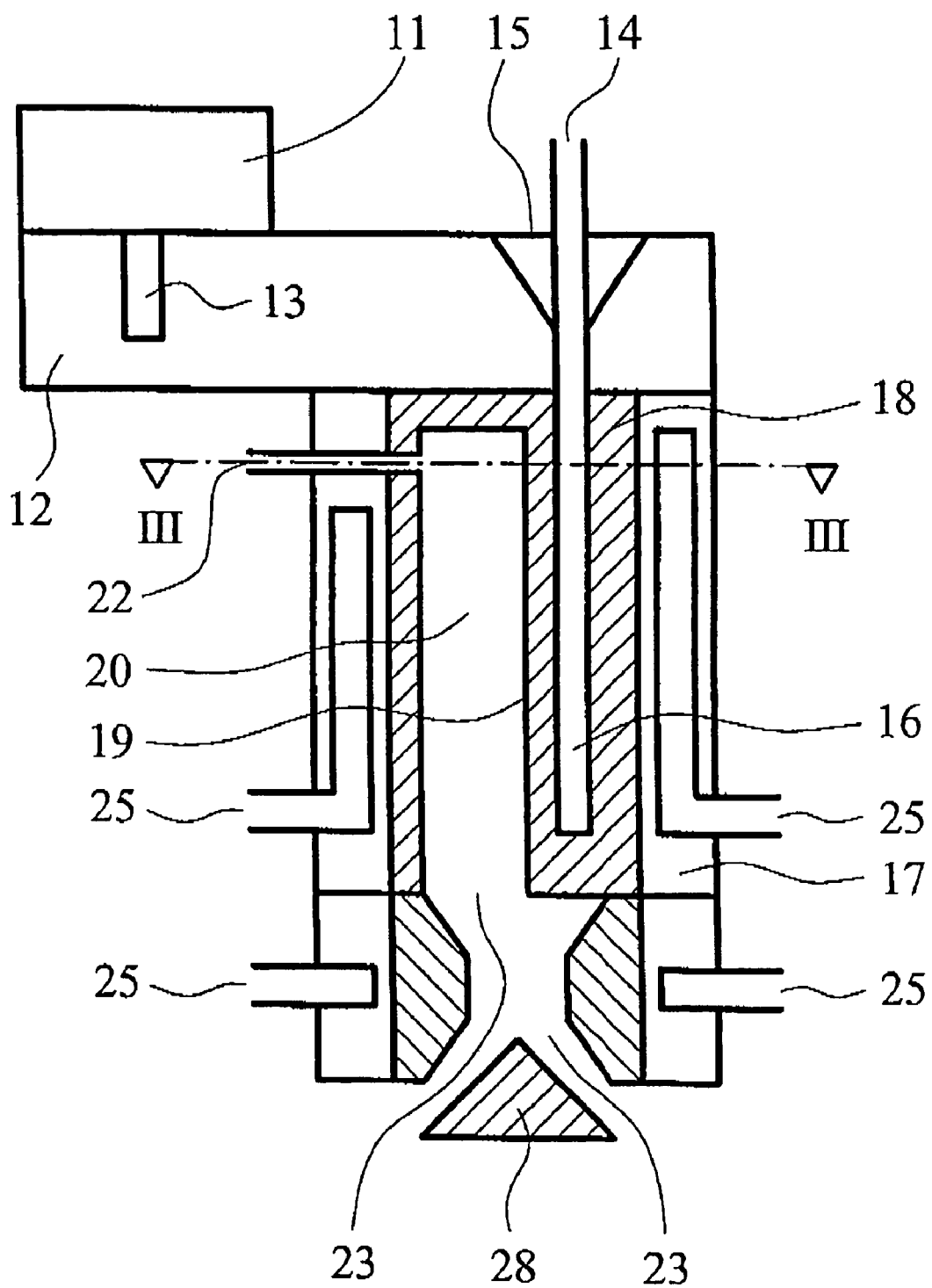
FIG. 1 shows a sectional view through a first embodiment of an apparatus in accordance with the invention for generating excited and/or ionized particles.

An injection part 15 for an inner conductor 16 is arranged close to the end of the hollow conductor 12 which is opposite of the antenna 13. Furthermore, an outer conductor 17 is provided, with an excitation chamber 20 being located between the inner conductor 16 and the outer conductor 17. The excitation chamber 20 is arranged in a cylindrical insulator 18 which can be made integrally or of several parts from one or several different insulating materials. The insulator 18 is preferably configured in a circular-cylindrical shape. Potential insulating materials may comprise ceramics or glass which are well capable of dissipating the heat produced by the plasma from the surfaces in the excitation chamber 20.

The excitation chamber 20 has a gas inlet 22 for a process gas and a gas outlet 23 for discharging the excited particles. The gas outlet 23 is arranged in the excitation chamber 20 preferably remote from the gas inlet 22, especially on one face side of the insulator 18 in order to enable an even flow of process gas through the excitation chamber 20. The volume, shape, cross section, length in the direction of passage, wall material and the arrangement of the chambers between the inner conductor 16 and the outer conductor 17 and the choice of the associated insulator are chosen according to the desired application and the gases to be processed. In particular, the gas inlet 22 is arranged close to generator 11 and the gas outlet 23 at the end opposite with respect to the excitation chamber 20.

The excitation chamber 20 comprises a wall coating 19 with a further insulating material such as $SiO_2$, $Al_2O_3$, AlN, $ZrO_2$. A plasma is produced in the excitation chamber 20 with the process gas. Helium, $NF_3$ and/or hydrogen are supplied via gas inlet 22 for generating a plasma.

For cooling purposes the inner conductor 16 is supplied with coolant via a coolant inlet 14 and the outer conductor 17 via a coolant inlet 25, so that the inner conductor 16 and the outer conductor 17 can be kept at a temperature optimal for generating plasma. The coolant ensures that the heat produced in the generation of the plasma is discharged rapidly to the inner conductor 16 and/or the outer conductor, and thus the walls of the excitation chamber 20 are kept as cool as possible, so that the chemical attack of the plasma on the inner surface of the excitation chamber 20 is minimized.

A gas distributor 28 is arranged on the gas outlet 23 of the excitation chamber 20, which distributor is cooled with a cooling device (not shown) in order to reduce the chemical attack of the excited particles on the surface of the gas distributor. Preferably, the gas distributor 28 is provided with a cone-like or funnel-like configuration in order to achieve an even distribution of the excited particles on a workpiece.

Figure 2:
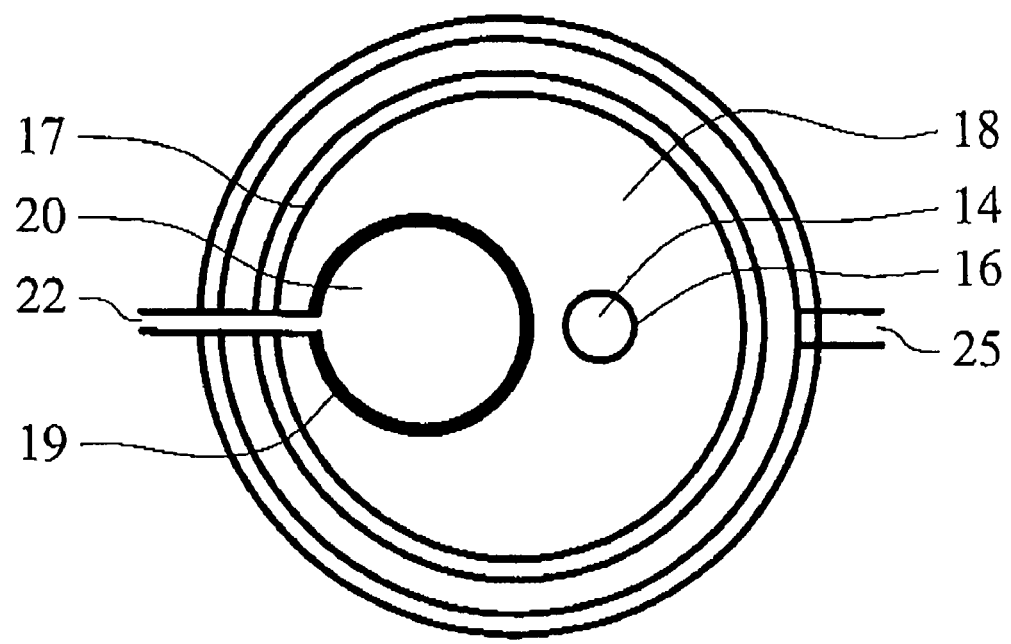
FIG. 2 shows a cross-sectional view along lines of intersection III-III of the first embodiment of the apparatus in accordance with the invention for generating excited and/or ionized particles.

FIG. 2 shows a cross-sectional view along the line of intersection III-III. Once can recognize that the excitation chamber 20 has a circular cross-section and is arranged off-center in the circular-cylindrical insulator 18. Inside conductor 16 also has a circular cross section and is arranged off-center parallel to the insulator axis in such a way that the excitation chamber 20 lies on the longest connecting line to the circumferential edge. The outer conductor 17 can extend about the entire circumference of the region of the cylindrical insulator 18. Preferably in order to reduce the energy losses, the outer conductor 17 is arranged in the shown embodiment as a cylinder segment on the circumferential edge of the insulator 18 that the excitation chamber 20 substantially lies between the outer conductor 17 and the inner conductor 18.

Elements of the same function are provided with the same reference numerals in the following embodiments.

Figure 3:
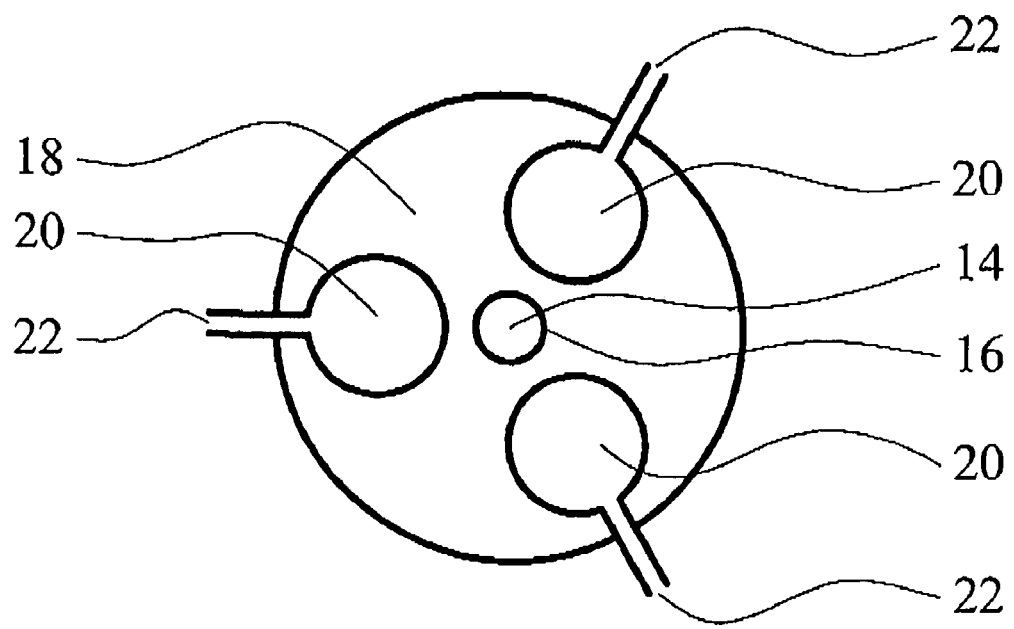
FIG. 3 shows a cross-sectional view of a second embodiment of the apparatus in accordance with the invention for generating excited and/or ionized particles.

FIG. 3 shows a cross-sectional view of a further embodiment of the plasma generation unit. The plasma generation unit comprises three excitation chambers 20 which are arranged evenly about the inner conductor 16 in insulator 18. In contrast to the preceding embodiments, the inner conductor 16 is arranged in the middle in the insulator 18, so that the inner conductor 16 and the outer conductor 17 are arranged coaxially with respect to each other. The excitation chambers 20 are grouped evenly about the inner conductor 16, so that they each have the same distance from each other. The respective connecting lines between the central inner conductor 16 and the central points of the excitation chambers 20 have an angle of 120° with respect to each other.

It is also possible to provide more than three excitation chambers 20 in the insulator 18. It must be ensured that the excitation chambers 20 are always separated from each other by insulating material. A larger number of excitation chambers 20 leads to the consequence that in the case of an even radius of the insulator 18 the sizes of the chambers 20 will decrease. It is not necessary that the several excitation chambers 20 are provided with the same cross-sectional surface or with the same diameter. The cross-sectional sizes of the excitation chambers can be different and adjusted to their intended use. It can be provided in particular to arrange pairs of excitation chambers 20 of the same diameter in the insulator 18, with two mutually oppositely paired excitation chambers having the same diameter. Moreover, the shape of the cross section of the excitation chambers 20 need not be circular, but can substantially assume any desired geometrical shape which is suitable for the generation of a plasma. In particular, the distances of the excitation chambers 20 from the inner conductor 16 and/or outer conductor 17 can be different in each case.

The excitation chambers 20 are configured in this embodiment in substantially the same manner as has already been described in connection with the first embodiment. The diameter of the excitation chamber 20 is smaller in this embodiment than the distance between the circumferential edge of the insulator 18 and the outside edge of the inner conductor 16, so that the excitation chamber 20 is completely enclosed by the insulating material of insulator 18.

In order to supply the excitation chambers 20 with a different excitation frequency it can be provided that each of the excitation chambers 20 is associated with a cylinder segment as an outer conductor 17. As a result, a separate excitation frequency can be provided for each excitation chamber 20 with the help of a separate generator 11, with the inside conductor 6 being used by each of the generators 11. As a result of this arrangement it is still possible to operate the excitation chambers 20 substantially independent from each other. For this purpose, each of the excitation chambers 20 comprises its own gas inlet 22, so that different process gases can be introduced into each of the excitation chambers 20. The gas outlets 23 of the excitation chambers 20 can be arranged on the face side and combined into a common outlet.

The relevant aspect is among other things that different plasmas are generated in the several excitation chambers 20, such that different process gases are supplied to the excitation chambers. Plasma generation is different in the individual excitation chambers 20, with the process gases and the geometrical conditions of the chambers 20 preferably being adjusted to each other in such a way that plasma generation is optimized.

Figure 4:
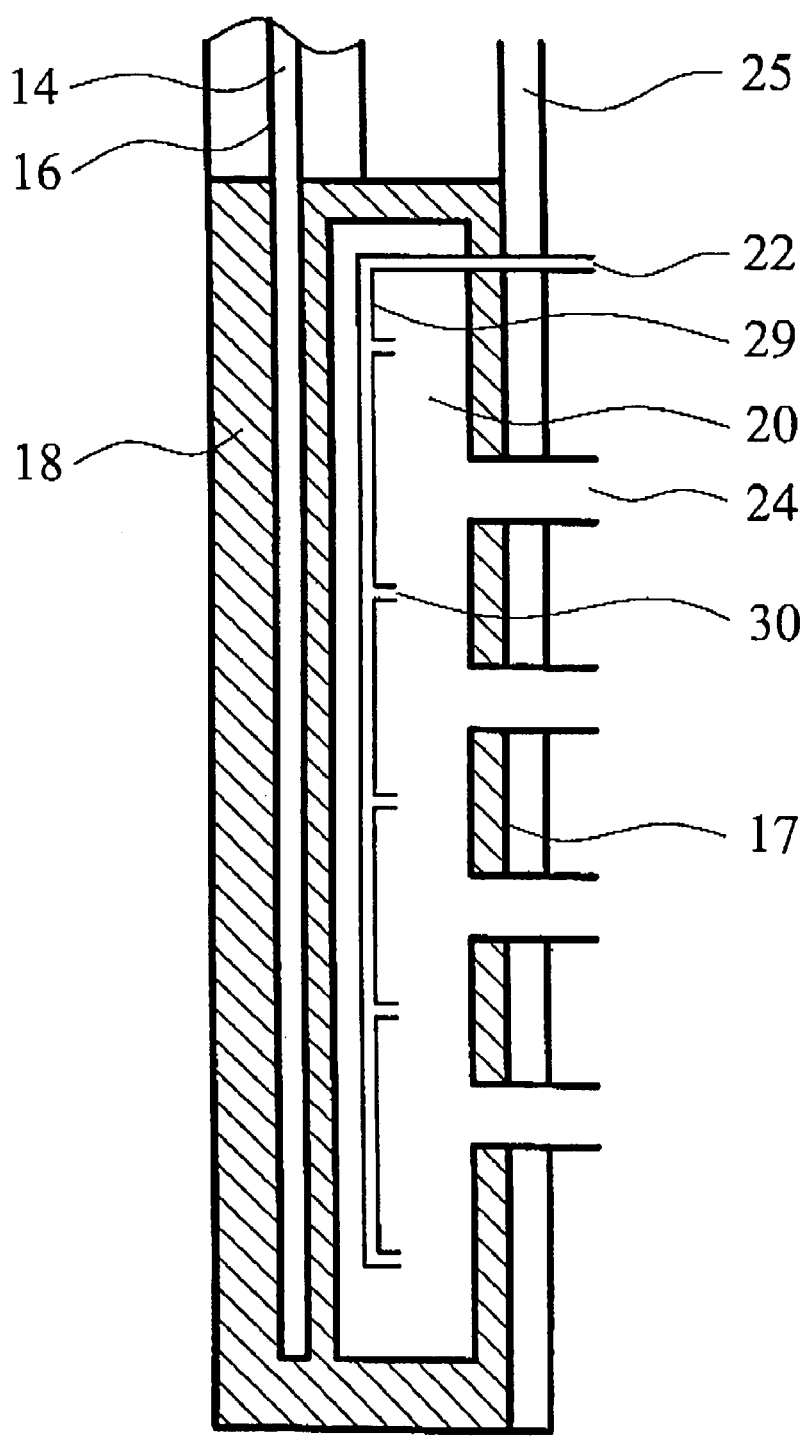
FIG. 4 shows a cross-sectional view of a third embodiment of the apparatus in accordance with the invention for generating excited and/or ionized particles.

FIG. 4 shows a third embodiment of the present invention. FIG. 4 shows a sectional view from the insulator 18, the inner conductor 16, the excitation chamber 20 and the outer conductor 17 which is attached to the circumferential edge of the insulator 18. The gas inlet 22 is connected with a tubular gas distributor 29 which extends in the interior of the excitation chamber 20. The gas distributor 29 comprises gas inlet openings 30, through which the gas process gases supplied through the gas inlet 22 are distributed in the chamber 20. In particular, the gas distributor 29 is arranged in a boundary section of the excitation chamber 20 which is situated as close as possible to the inner conductor 16 and as far away as possible from the outer conductor 17. Gas outlets 24 are arranged on a further boundary section of the excitation chamber 20 facing the outer conductor 17.

In the illustrated embodiment, the excitation chamber 20 comprises four gas outlets 24 which are distributed substantially evenly over the length of the excitation chamber. A more even distribution of the released excited particles is thus achieved, as a result of which they can reach a workpiece in the most evenly distributed manner. Depending on the application, this is advantageous as compared with only one gas outlet 24. In order to achieve a still more even distribution of the excited particles on the workpiece, the excitation chamber can be provided with a gas outlet extending over its length. Said gas outlet can be provided as a slot of a defined length and width.

In particular, the gas outlets 24 and the gas inlet openings 30 are arranged in an offset manner relative to each other with respect to the length of the excitation chamber 20, so that when the process gases flow through the excitation chamber 20 they have to cover a longer path in the excitation chamber 20 and the dwell time in the chamber 20 is thus increased.

The outer conductor 17 substantially rests on the circumferential edge of the cylindrical insulator 18, with the gas outlets 24 penetrating the outer conductor 17 and the insulator 18. The outer conductor 17 is configured in such a way that coolant can be guided through the same in order to cool the outer conductor 17 and the adjacent insulating material of the insulator 18. A respective cooling of the insulator 18 and the inner conductor 16 and the outer conductor 17 is necessary in order to achieve the highest possible plasma efficiency.

Figure 5:
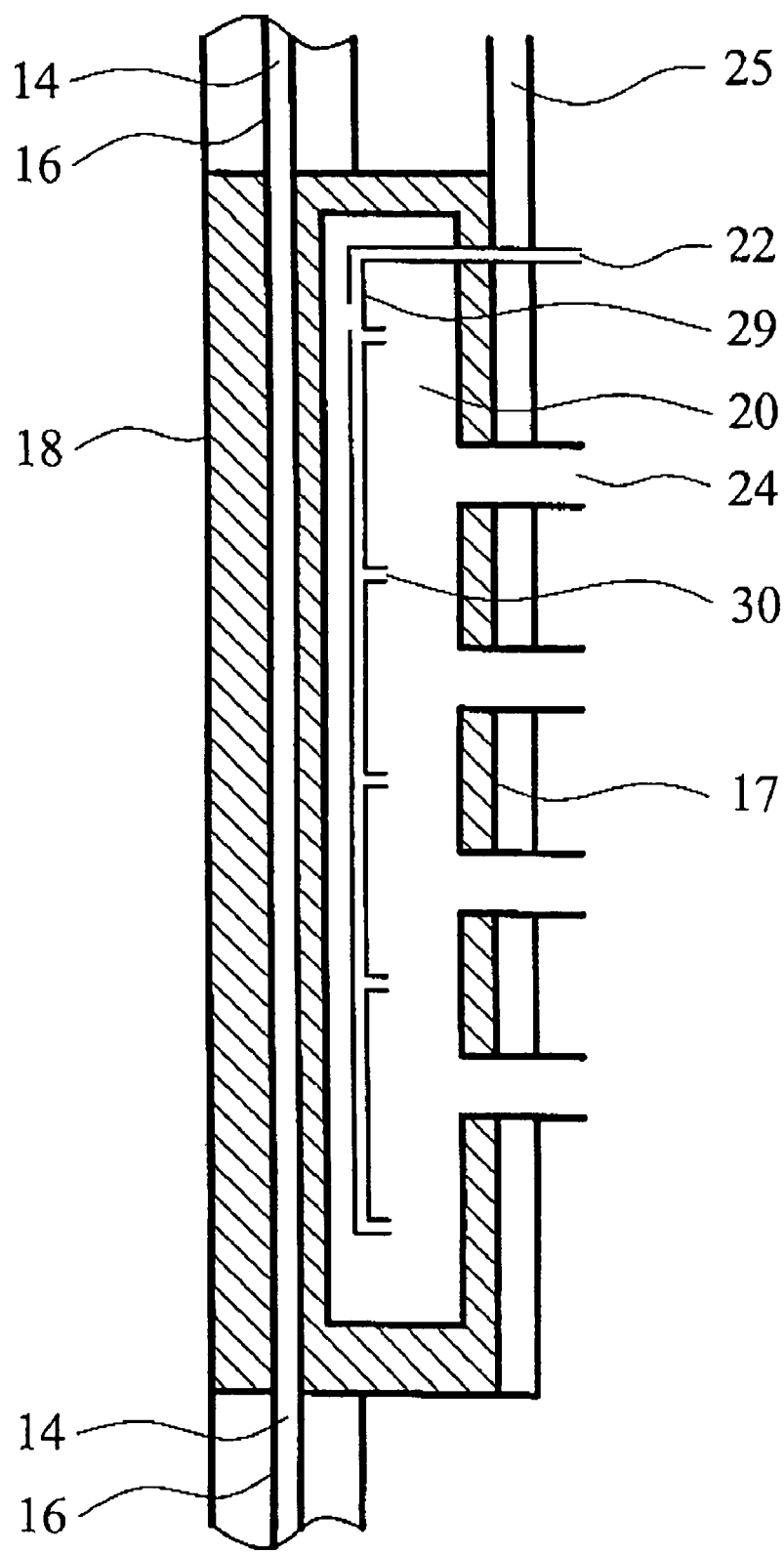
FIG. 5 shows a cross-sectional view of a fourth embodiment of the apparatus in accordance with the invention for generating excited and/or ionized particles.

The embodiment shown in FIG. 5 substantially differs from that of FIG. 4 in such a way that external connections for the inner conductor 16 and the outer conductor 17 are provided at both ends of the cylindrical insulator 18, with the inner conductor 16 having two open ends, so that electric power can be supplied from both sides in the form of an electromagnetic wave via a coaxial line and coolant can flow from one end to the other end. A better cooling effect of the inner conductor 16 and the enclosing insulator 18 can thus be achieved depending on the flow of the coolant.

Figure 6:
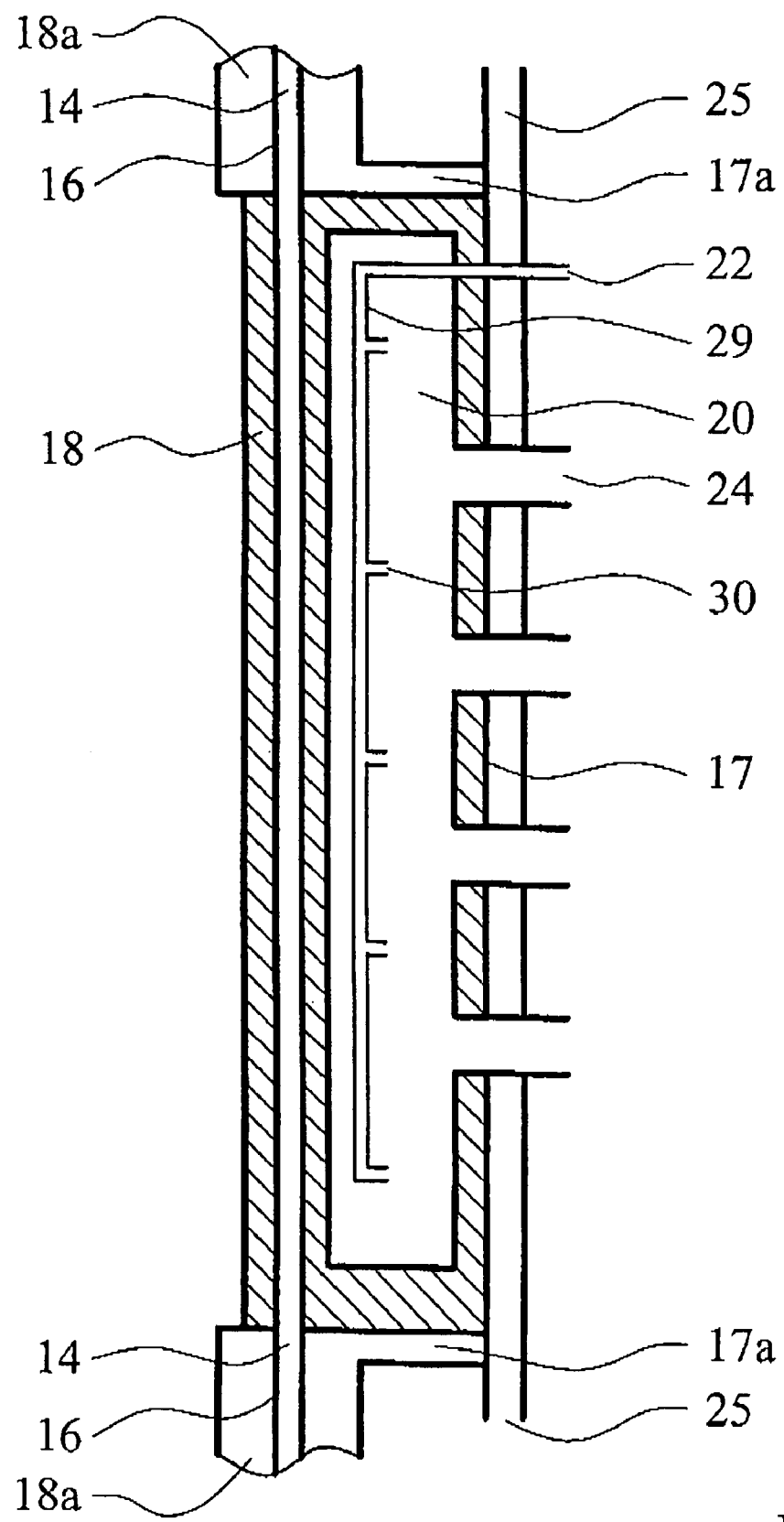
FIG. 6 shows a cross-sectional view of a fifth embodiment of the apparatus in accordance with the invention for generating excited and/or ionized particles.

The embodiment according to FIG. 6 shows that power inlets in the form of a coaxial line are provided at the two ends of the excitation chamber 20. FIG. 6 further shows a possibility of coolant distribution and supply. The excitation power is transferred to the excitation chamber 20 by means of a hollow conductor in which the coolant for the outer conductor 17 is also guided simultaneously. The inner conductor 16 is provided with a substantially tubular configuration, with the coolant also being guided in inner conductor 16. When the supply of the excitation power occurs by way of the coaxial hollow conductor for example, the coolant inlets 14, 25 for the inner conductor 16 and the outer conductor 17 can be arranged close to one another. The constructional complexity of a cooling device will thus decrease considerably.

The outer conductor 17 is further configured in such a way that it encloses only a section of the ribbed cylindrical insulator 18. Preferably, it is situated opposite of the inner conductor 16. The outer conductor 17 is connected in the illustrated embodiment via conductive bridges 17a with the outer coaxial conductor 18a. The connection can occur alternatively in a merely capacitive manner via the electromagnetic wave.

Figure 7:
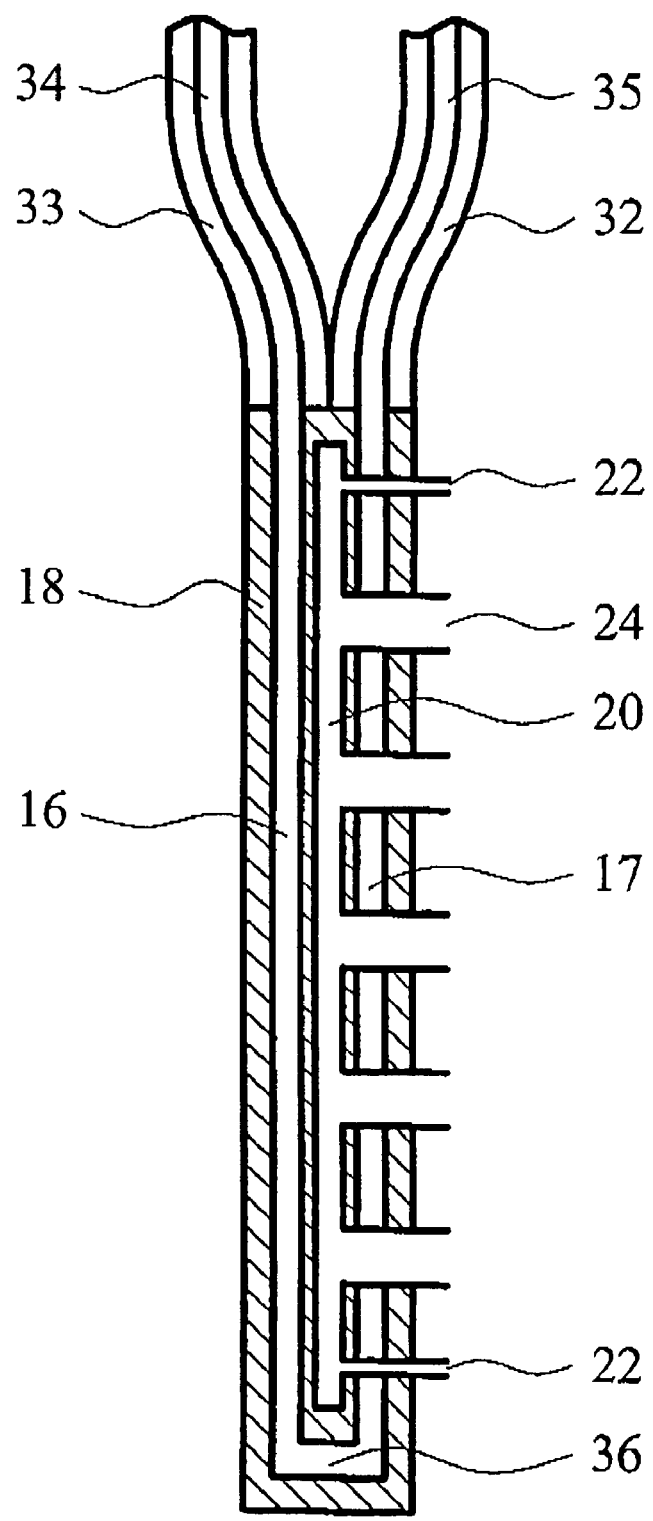
FIG. 7 shows a cross-sectional view of a sixth embodiment of the apparatus in accordance with the invention for generating excited and/or ionized particles.

FIG. 7 shows separate feeds for the outer conductor 17 and the inner conductor 16. The outer conductor 17 is connected with a first coaxial conductor 32, by which a part of the excitation power is transmitted and whose middle conductor is provided with a hollow configuration in order to supply the coolant to the outer conductor 17. The inner conductor 16 is connected in a comparable manner with the second coaxial conductor 33, by which a further part of the excitation power is transmitted and whose middle conductor is provided with a hollow configuration in order to supply the coolant to the inner conductor 16. In this embodiment, the inner conductor 16 and the outer conductor 17 are connected with each other at their ends at the floor in order to form a U-shaped cooling loop 36. The cooling loop 36 receives the excitation chamber 20 between themselves. A coolant inlet 34 is provided on one leg of the U-shaped cooling loop 36 and a coolant outlet 35 is arranged on the other leg.

Figure 8:
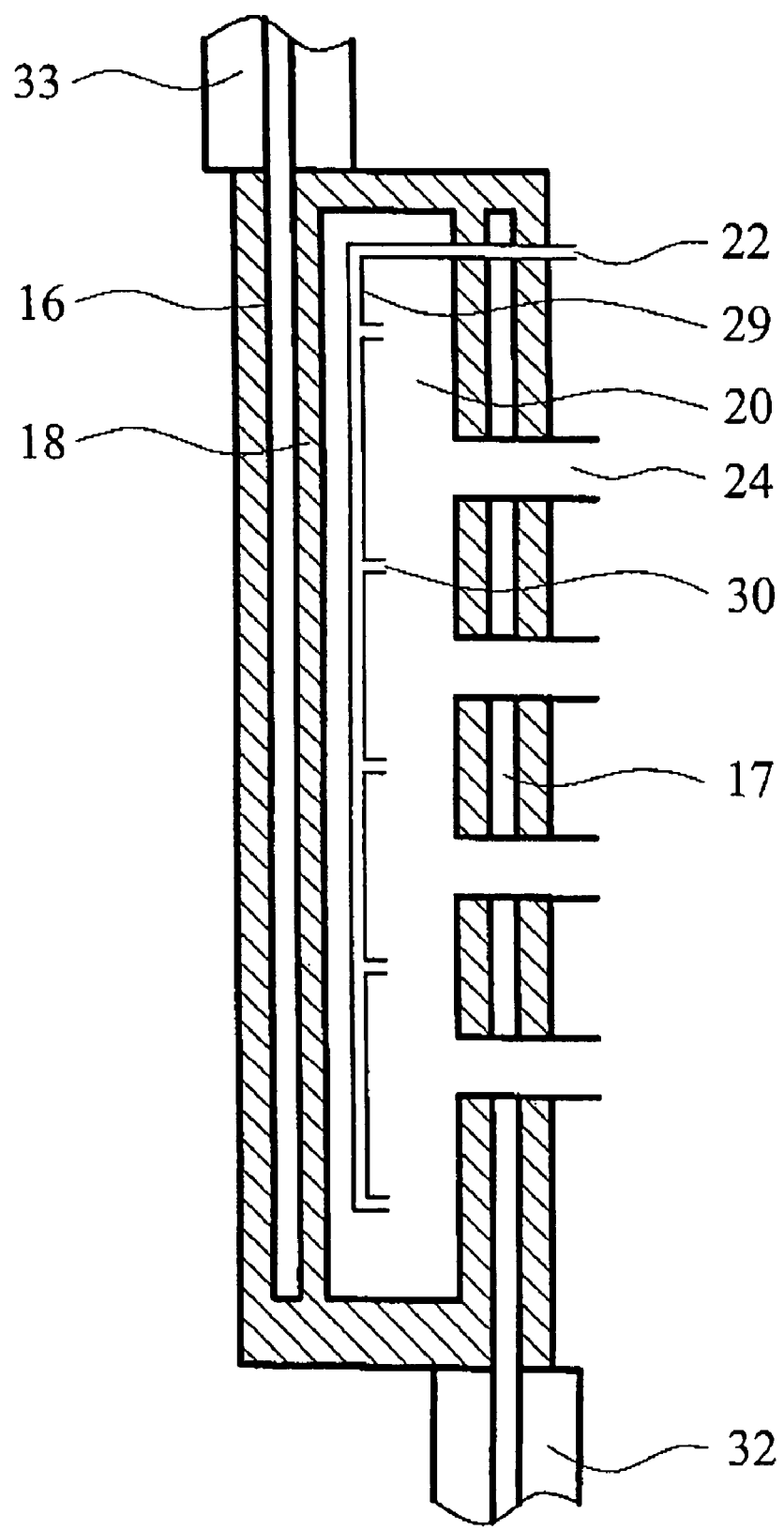
FIG. 8 shows a cross-sectional view of a seventh embodiment of the apparatus in accordance with the invention for generating excited and/or ionized particles.

FIG. 8 shows a further embodiment of the present invention. The inlets for the excitation power are arranged on mutually opposite ends of the excitation chamber.

The invention claimed is:

1. An apparatus for generating excited or ionized or excited and ionized particles in a plasma comprising:
   a generator for generating an electromagnetic wave and an excitation chamber;
   a plasma zone in which the excited or ionized or excited and ionized particles are formed, and;
   an inner conductor and an outer conductor, wherein at least one excitation chamber is arranged in an insulating material off-center relative to a ring-cylindrical outer conductor.

2. An apparatus according to claim 1, further comprising several excitation chambers arranged off-center relative to the outer conductor are arranged in the insulating material, which excitation chambers are distributed about the central axis of the ring-cylindrical outer conductor.

3. An apparatus according to claim 2, wherein the excitation chambers are distributed symmetrically about the central axis of the ring-cylindrical outer conductor.

4. An apparatus according to claim 2, wherein the distances of the excitation chambers relative to the inner conductor and/or outer conductor are different.

5. An apparatus according to claim 2, wherein the outlets of the excitation chambers are combined into a common outlet.

6. An apparatus according to claim 2, wherein the diameters of the excitation chambers are different.

7. An apparatus according to claim 2, wherein pairs of excitation chambers of the same diameter are present and that two excitation chambers situated opposite of each other in pairs have the same diameter.

8. An apparatus according to claim 2, wherein the walls of the excitation chambers have different insulating materials.

9. An apparatus according to claim 2, wherein the excitation chambers are arranged in blocks of different materials.

10. An apparatus according to claim 1, wherein the inner conductor is arranged off-center relative to the ring-cylindrical outer conductor and adjacent to which lies at least one excitation chamber.

11. An apparatus according to claim 1, wherein the inner conductor is arranged coaxially relative to the outer conductor.

12. An apparatus according to claim 1, wherein the outer conductor is arranged in the form of a ring-cylinder sector and that the at least one excitation chamber is arranged between the outer conductor and the inner conductor.

13. An apparatus according to claim 12, wherein the outer conductor comprises several segments.

14. An apparatus according to claim 12, wherein the outer conductor has a rectangular cross section.

15. An apparatus according to claim 13, wherein at least one of the segments is connected in an electrically non-conductive manner with outer coaxial conductor.

16. An apparatus according to claim 1, further comprising several inner conductors which are connected with each other at their ends at the floor side and forming a U-shaped cooling apparatus receiving the excitation chamber between themselves, with a coolant inlet being present on one leg and a coolant outlet being present on the other leg.

17. An apparatus according to claim 1, further comprising a gas distributor which is connected with the gas inlet is arranged in the interior of the excitation chamber.

18. An apparatus according to claim 17, wherein the gas distributor is arranged as a pipe with distributed outlet openings.

19. An apparatus according to claim 1, wherein the excitation chamber is provided with several gas outlets distributed over its length.

20. An apparatus according to claim 1, wherein the excitation chamber is provided with a gas outlet extending over its length.

21. An apparatus according to claim 20, wherein the gas outlet is arranged as a slot.

22. An apparatus according to claim 1, further comprising a gas distributor arranged at a gas outlet of the excitation chamber.

23. An apparatus according to claim 22, wherein the gas distributor is cooled.

24. An apparatus according to claim 22, wherein the gas distributor is provided with a conical configuration.

25. An apparatus according to claim 1, wherein the excitation chamber has two power inlets situated opposite of each other.

26. An apparatus according to claim 1, wherein the inner or outer or inner and outer conductor comprises two mutually opposite inlets with respect to the excitation chamber, wherein the mutually opposite inlets are arranged either within the inner conductor or within the outer conductor or one within the inner conductor and one within the outer conductor accordingly.

27. An apparatus according to claim 1, wherein the inlet of the inner conductor and the inlet of the outer conductor are opposite of each other with respect to the excitation chamber.

28. A method for generating excited or ionized or excited and ionized particles in a plasma by means of an apparatus according to claim 1, with several excitation chambers, wherein different process gases are supplied to the excitation chambers and that the plasma generation is different in the individual excitation chambers.

* * * * *